United States Patent [19]
Barret et al.

[11] Patent Number: 5,780,895
[45] Date of Patent: *Jul. 14, 1998

[54] FORWARD OVERVOLTAGE PROTECTION CIRCUIT FOR A VERTICAL SEMICONDUCTOR COMPONENT

[75] Inventors: Jean Barret, Eguilles; Daniel Quessada, Pourrieres, both of France

[73] Assignee: SGS-Thomson Microelectronics S.A., Saint Genis, France

[*] Notice: The term of this patent shall not extend beyond the expiration date of Pat. No. 5,543,645.

[21] Appl. No.: 573,300

[22] Filed: Dec. 15, 1995

Related U.S. Application Data

[63] Continuation of Ser. No. 157,362, Nov. 23, 1993, Pat. No. 5,543,645.

[30] Foreign Application Priority Data

Oct. 24, 1992 [FR] France ................... 92 14478

[51] Int. Cl.$^6$ ................... H01L 29/76; H01L 29/94
[52] U.S. Cl. ................... 257/328; 257/336; 257/337; 257/339; 257/347; 257/360
[58] Field of Search ................... 257/328, 336, 257/337, 339, 341, 360

[56] References Cited

U.S. PATENT DOCUMENTS

| | | | |
|---|---|---|---|
| 5,045,902 | 9/1991 | Bancal | 357/23.4 |
| 5,119,162 | 6/1992 | Todd et al. | 357/43 |
| 5,136,349 | 8/1992 | Yilmaz et al. | 357/23.4 |
| 5,191,395 | 3/1993 | Nishimura | 257/328 |
| 5,296,723 | 3/1994 | Noba et al. | 257/328 |
| 5,543,645 | 8/1996 | Barret et al. | 257/328 |

FOREIGN PATENT DOCUMENTS

| | | |
|---|---|---|
| A-3540433 | 5/1986 | Germany. |
| A-61137368 | 6/1986 | Japan. |
| A-61296770 | 12/1986 | Japan. |
| A-62144357 | 6/1987 | Japan. |
| A-397269 | 4/1991 | Japan. |
| A-3105977 | 5/1991 | Japan. |
| A-4132266 | 5/1992 | Japan. |

OTHER PUBLICATIONS

Patent Abstracts of Japan, vol. 14, No. 362, (E-960), Aug. 6, 1990 & JP-A-21 28 474 (NEC), May 16, 1990.

*Primary Examiner*—Ngân V. Ngô
*Attorney, Agent, or Firm*—Wolf, Greenfield & Sacks, P.C.

[57] ABSTRACT

A MOS-type vertical power transistor formed in a semiconductor layer having a bottom surface which constitutes a first electrode and a top surface, the transistor further includes a large number of identical cells that are connected in parallel with a second electrode and a control electrode formed on the top surface. The power transistor includes at least one additional cell, formed in the semiconductor layer, having the same shape as the identical cells but a smaller lateral size than the identical cells, and a circuit to turn on the power transistor when the additional cell reaches an avalanche mode.

8 Claims, 5 Drawing Sheets

5,780,895

FORWARD OVERVOLTAGE PROTECTION CIRCUIT FOR A VERTICAL SEMICONDUCTOR COMPONENT

This application is a continuation of application Ser. No. 08/157,362, filed Nov. 23, 1993, entitled FORWARD OVERVOLT PROTECTION CIRCUIT FOR A VERTICAL SEMICONDUCTOR COMPONENT and now U.S. Pat. No. 5,543,645.

BACKGROUND OF THE INVENTION

1. Field of the Invention

The present invention relates to high voltage vertical power transistors that are circuits vertically fabricated in a silicon wafer whose rear surface is connected to a high voltage. The invention is directed to MOS-type vertical power transistors or insulated-gate bipolar transistors (IGBT's), and more particularly applies to Smart Power switches, that are circuits including on a same silicon chip vertical power components and logic circuits for controlling such components.

2. Discussion of the Related Art

Power transistors are designed to withstand a predetermined forward voltage (for example, 400 volts). The application of a higher voltage to the circuit by the external circuit causes a breakdown of the device that can damage it. For example, the switching of an inductive load generates an overvoltage with a determined quantity of energy to be dissipated. Such over-voltage is applied to the power switch that is off, or is in a transient off state. One of the solutions to protect the transistor is to provide a signal onto its control electrode to briefly bring the transistor in a conductive state during a period long enough to dissipate the excess energy.

It is therefore desirable to provide a device that goes to conduction state for a value slightly lower than the breakdown voltage of the power transistor(s) in order to, for example, trigger the conduction of the transistors before their breakdown threshold, thus avoiding damage.

In the following description, power MOS transistors are always referred to. However, it is clear that the whole description also applies to IGBT's whose structure is substantially identical, except for the fact that they include on the side of the rear surface a layer having a conductivity opposite to the conductivity of the layer forming the rear surface of a power MOS transistor.

In order to better illustrate the problem that the invention aims at solving, FIG. 1 represents a cross-sectional view of an exemplary conventional dual structure including a vertical diffused MOS (VDMOS) transistor TP, two cells of which are represented. Such transistor is combined with logic circuits, including an N-channel MOS transistor TL of which is illustrated. The vertical MOS transistor is comprised of a large number, for example 10,000, of identical cells.

The structure is fabricated in a substrate 0 of a first conductivity type, for example of the N-type. A cell of the power MOS transistor TP includes a well 1 (1-1, 1-2) formed by a P-type diffusion in the substrate. In each well 1-1, 1-2 is formed an N$^+$-type annular diffusion region that constitutes an element of the power transistor source. Diffusions 2 are interconnected through a conductive layer 3 that is, for example, made of aluminum. The surface peripheral areas of regions 1 form a channel region 4 of the power transistor. Additionally, each well 1 generally includes a deeper and more highly doped central portion 5 (5-1, 5-2).

Each cell of the power MOS transistor TP includes a gate 6, formed above the surface peripheral areas by a polycrystalline silicon layer. Gate 6 is separated from substrate 1 by an oxide layer 7. All the gates 6 are interconnected.

The rear surface 10 of substrate 1 includes an highly doped layer 11 of the first conductivity type which is coated with a drain metallization 12.

The MOS transistor TL of the logic portion also includes a P-type well 14 region formed in the substrate. Well 14 includes two N$^+$-type areas, the first area forming source 15 and the second area forming the drain 16 of transistor TL. Transistor TL includes a gate 18 formed by a polycrystalline silicon layer above the well region. Gate 18 is separated from well 14 by an oxide layer 19. The diffused areas forming source 15 and drain 16 are connected to a conductive line labeled 20, 21, respectively. The conductive lines 20, 21 are for example of aluminum.

Conventionally, a P$^+$-type area 23 connected to a conductive layer 24 is also provided in well 14. Area 23 and the conductive layer 24 connect well 14 to ground.

Under normal operation, the metallization of the rear surface 12 is connected to a positive voltage, and the front surface metallizations 3 of the power transistor are connected to a voltage that is negative with respect to the positive voltage, for example, a voltage close to the ground voltage.

The problem to be solved is to avoid a switching on, due to breakdown, of the power transistor cells, i.e. due to an avalanche phenomenon of the junction between substrate 0 and the P-type wells of the transistor cells (1-1, 5-1; 1-2, 5-2) when the drain voltage increases while the transistor is off. Such a switching on is undesirable because it may cause heating of this junction where the avalanche is generated due to excessive flow of current, and this heating can be destructive. It should be also noted, in the case of the represented integrated circuit including a logic portion, that an avalanche breakdown may occur at the junction between the substrate and the wells of the logic component cells. Conventionally, the structure is designed so that this latter junction breaks down after the junction of the power transistor cells.

An avalanche diode, having a triggering threshold lower than the threshold of the active cells of the power MOS transistor can be conventionally used, for example as illustrated in FIG. 2 which represents the power transistor TP with its drain terminal D (12), source terminal S (3) and gate terminal G (6). Transistor TP includes a reverse conduction diode 30 which corresponds to the junction between P-type well 5 and the N-type substrate 0 of the transistor TP. The reverse breakdown of this diode corresponds to the avalanche breakdown of the power transistor cell TP. An avalanche diode 31 can be connected between the drain and the gate and can be such that an avalanche voltage of diode 31 plus a forward voltage drop of a series diode 32 is less than the breakdown voltage of the power transistor and is therefore turned on before the power transistor enters the avalanche mode. The series diode 32 is used to avoid the derivation of normal gate control signals. The circuit of FIG. 2 is represented by way of example only because various alternative circuits for the triggering of a main transistor occurring after the triggering of a detection avalanche diode are known. It should be noted that, in most of these circuits, as illustrated in FIG. 2, the cathode of the avalanche diode is connected to the drain of the power transistor. This cathode or drain corresponds to the common terminal 12 of FIG. 1.

A different approach is described in the U.S. Pat. No. 5,136,349 in which each individual cell of a power MOS transistor is specifically designed so as to include a central avalanche diode that goes to avalanche mode shortly before the cells of the power transistor. Such structure has two drawbacks. The first drawback is that a new design of all the cells of a power MOS transistor is required, whereas, normally, the manufacturers of power MOS transistors have already developed optimized cells. This new design involves a major task that does not take advantage of prior developments already made by manufacturers. The second drawback is that major adjustment tasks are required to design the shape of the avalanche diode so that its triggering threshold is adequately determined with respect to the avalanche threshold of the power transistor cells.

SUMMARY OF THE INVENTION

An object of the invention is to provide, in a vertical power transistor, a forward overvoltage protection structure that can be fabricated in a semiconductor wafer including a power transistor component without requiring any modification in the design of the cells of the power transistor.

Another object of the invention is to provide such a protection structure whose triggering threshold is accurately determined with respect to the avalanche threshold of the cells of the power transistor.

A further object of the invention is to provide such a protection structure that can be made without modification of the manufacturing method of the power transistor component including one or several power transistors and, possibly, a control logic circuit.

To achieve this object, the invention provides a MOS or IGBT-type vertical power transistor having a bottom surface which constitutes a first main electrode and a top surface of a semiconductor substrate which includes a large number of identical cells that are parallel connected with a second main electrode and a control electrode. Such vertical power transistor further includes at least one additional cell, formed in the top surface, having the same shape as the power transistor cells but a smaller lateral size than said identical power transistor cells, and means to turn on the power transistor when the additional cell goes to avalanche mode.

In other words, the invention provides a VDMOS or IGBT-type power transistor comprised of a plurality of identical active cells, each of which includes on the side of the upper surface of a substrate of a first conductivity type a low doped well of the second conductivity type, the low doped well having a deeper and more highly doped central portion, a region substantially peripheral and within each well having a highly doped level of the first conductivity type, a first main electrode contacting an upper surface of the central region and the peripheral region, a control electrode being disposed, with interposition of an insulating layer, over a periphery of each well, a second main electrode being formed on the lower surface of the substrate. The vertical power MOS transistor further includes at least one additional cell fabricated according to the same technological steps as the active cells and disposed among them, each additional cell having a smaller lateral sized-low doped well region, at least at its deeper and more highly doped portion, than the identical cells, and its first main electrode being connected to a control circuit of the power transistor.

According to an embodiment of the invention, the cells of the power transistor are arranged in rows and columns, and the additional cells are disposed along a row arranged among the rows of the identical cells of the power transistor.

Due to the fact that the protection structure according to the invention uses as a detecting element a cell that is identical to, but only smaller than, the cells of the power transistor, the triggering threshold of this cell is determined in a reliable and reproducible way with respect to the forward avalanche threshold of the identical cells of the power transistor. More particularly, if one of the manufacturing parameters varies, the variation is identical for the detection cells as for the cells of the power transistor, and the triggering threshold difference substantially remains the same.

The foregoing and other objects, features, aspects and advantages of the invention will become apparent from the following detailed description of the present invention when taken in conjunction with the accompanying drawings.

DETAILED DESCRIPTION

Figure 3:
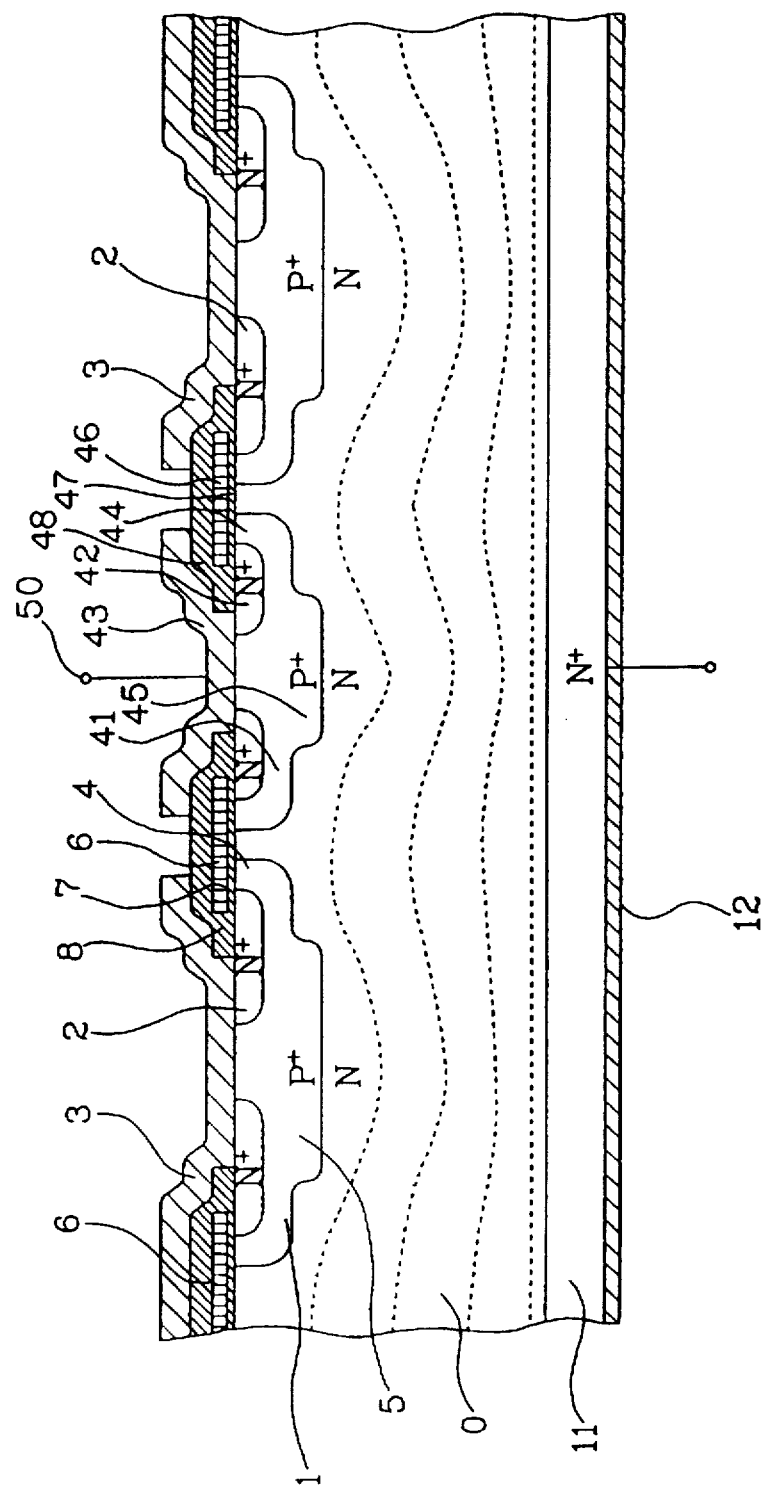
FIG. 3 is a partial cross-sectional view of a VDMOS transistor, according to the present invention, including an element for detecting overvoltages.

FIG. 3 is a partial cross-sectional view of a VDMOS power transistor including an overvoltage detecting component according to the present invention. In FIG. 3, components identical to those of FIG. I are designated by same reference numerals. Thus, the cells of the power transistor are formed in a substrate 0, whose bottom surface includes an N$^+$-type region 11 and which is coated with a metallization 12 that corresponds to the drain metallization of the MOS transistor. In a top surface of the cell are formed P-type wells 1 including a P$^+$-type highly doped central area 5. Annular-shaped source diffusions 2 are formed in each well and laterally delineate a peripheral channel region 4 which is overlaid by a gate contact 6, with interposition of an insulating layer 7 between the gate contact and the top surface, the insulating layer is usually an oxide layer. FIG. 3 also shows a layer of an insulating element 8, such as silicon dioxide, surrounding gate contact 6 to insulate this gate from the source metallization 3. The source metallization 3 is, as above indicated, in contact both with the central upper surface of well region 1 and with the N$^+$-type regions 2.

The present invention provides to the above described structure at least one additional cell whose elements 41-48 correspond to elements 1-8, respectively, of the cells of the power MOS transistor. The sole difference is that at least some of the elements of the additional cell have reduced lateral sizes as compared to the elements of the cells of the power MOS transistor.

FIG. 3 also shows dotted lines in the substrate which are equipotential lines existing in substrate 0 when drain 12 is subject to a relatively high voltage with respect to the source metallizations 3, but where the transistor cell is still not conductive; this relatively high voltage is lower than the breakdown voltage between the N-type region of the substrate and the P⁺-type regions of the various cells. It should be noted that the smaller size and depth of the P⁺ well of the additional cells causes a more accentuated curvature of the field lines in the vicinity of these cells. As a result, as known by those skilled in the art, when the drain voltage continues to be increased with respect to the source voltage, breakdown first occurs where the field lines have the more accentuated curvature, i.e., in the vicinity of the P⁺ doped well region of the additional cells. Thus, a detection diode that breaks down shortly before the power transistor cells is constituted by the additional smaller cells.

Since the additional cells have substantially the same shape but are smaller in size than the cells of the power transistor, the difference between the breakdown voltages of these additional cells and the cells of the power transistor is well defined and depends only on the size ratio between the additional cells and the cells of the power transistor.

Figure 4:
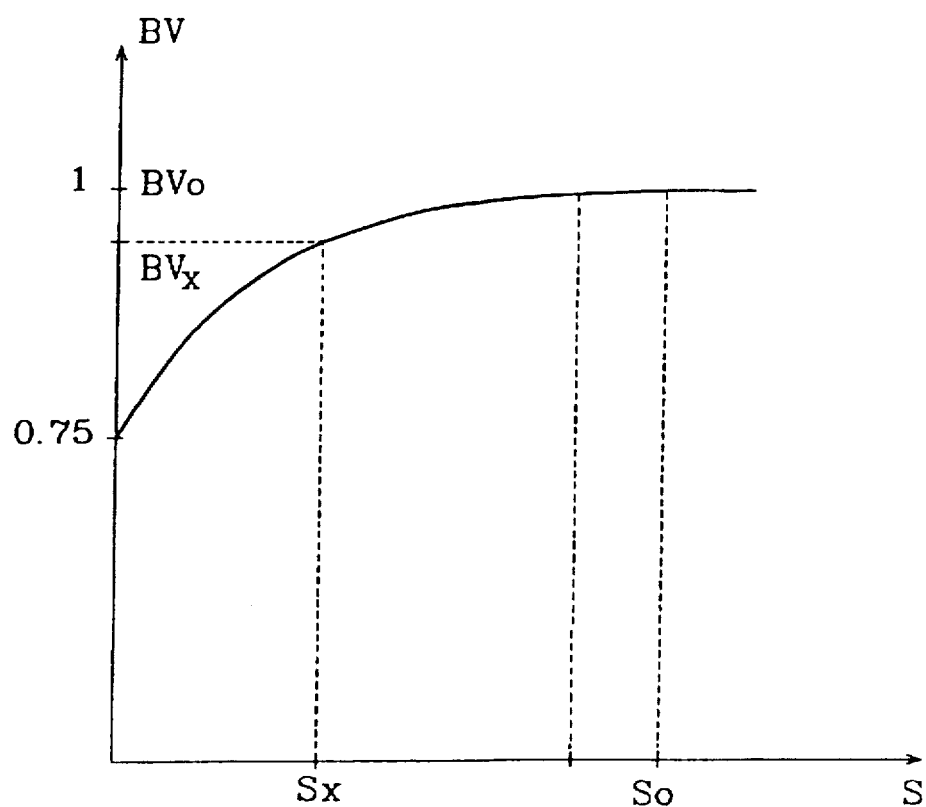
FIG. 4 is a curve illustrating the breakdown voltage of a transistor cell as a function of its size.

FIG. 4 illustrates the value of the breakdown voltage BV as a function of the overall size of the power transistor cells that, in the present example, are supposed to be square-shaped as viewed from above. It is assumed that the size of the active cells corresponds to a value SO and the size of the additional cell to a value Sx. A size difference of a few micrometers causes variations in the breakdown voltage of approximately 20%. The example of FIG. 4 corresponds to breakdown levels for a power component, in which the doping levels of the various layers are, for example, as follows:

region 11:>2 to 5×10¹⁸ atoms/cm³.

substrate 0:2 to 8×10¹⁴ atoms/cm³.

P⁺ regions 5 and 45:2 to 4×10¹⁸ atoms/cm³.

P wells 1 and 41 :2 to 4×10¹⁸ atoms/cm³.

N⁺ regions 2 and 42:2 to 4×10¹⁹ atoms/cm³.

Figure 1:
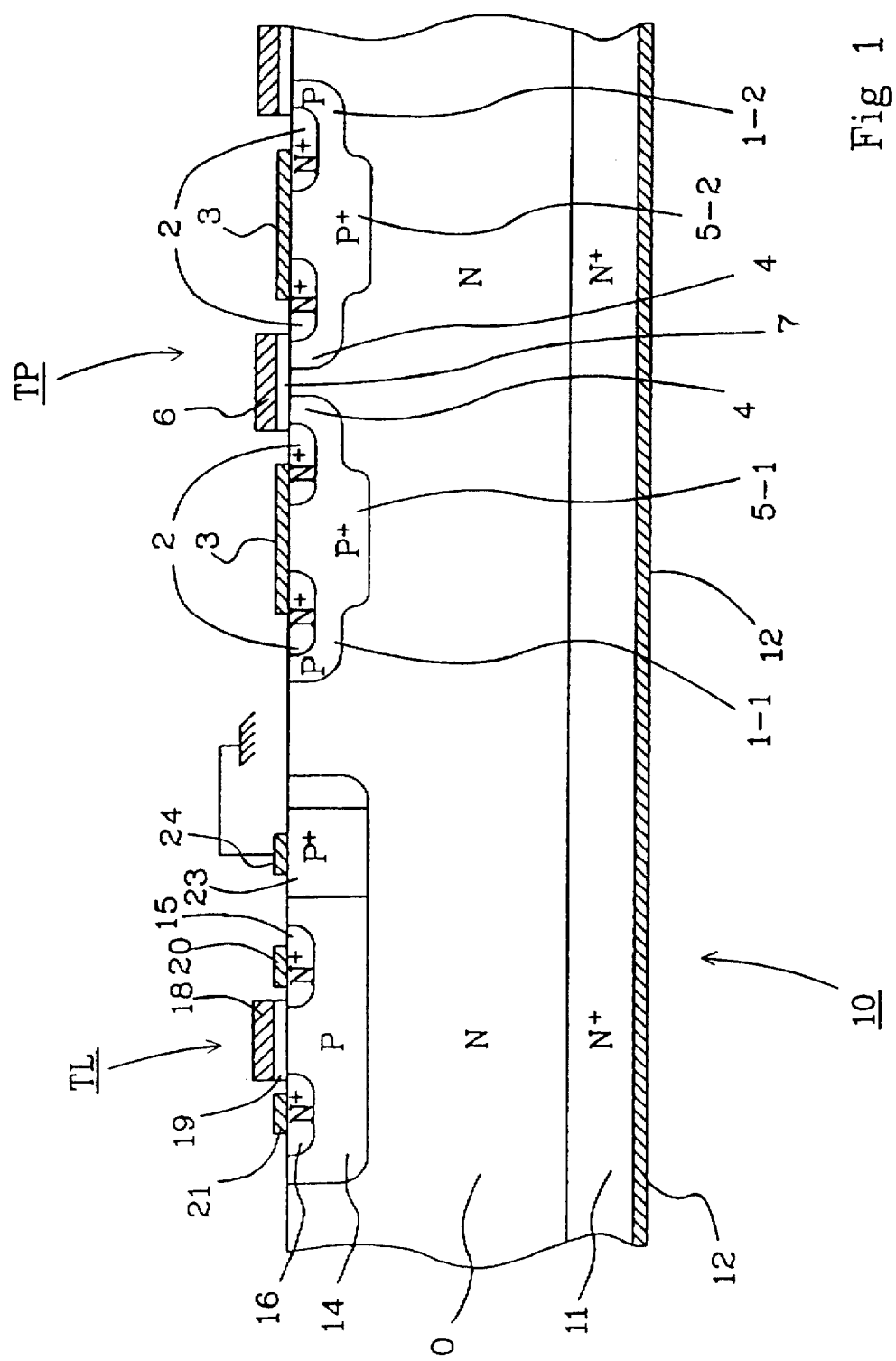
FIG. 1 is a partial cross-sectional view of a prior art semiconductor component including a VDMOS transistor and logic components.
Figure 2:
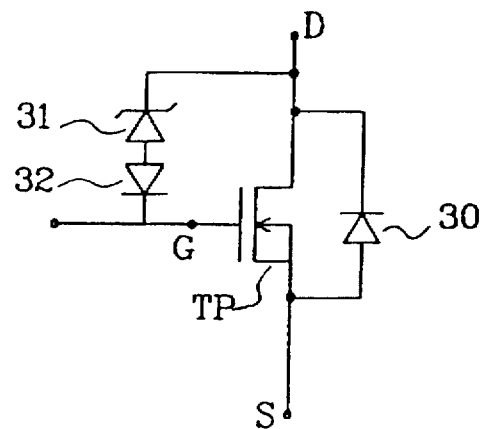
FIG. 2 schematically represents a circuit for protecting a power MOS transistor against forward over-voltage according to the prior art.

According to the present invention, it is possible to use one or more additional detection cells such as the detection cell illustrated in FIG. 3. The position of these cells with respect to the cells of the power transistor is selected by the circuit designers in order to reduce as much as possible the design task differences between a conventional component and a component including additional detection diodes according to the invention. The additional cells can, for example, form a row of cells intercalated among the numerous rows of cells of the power component. All the metallization contacts 43 of the additional cells are connected in parallel, with each source connected to a common terminal 50. The additional diodes according to the invention can, for example, then be connected in a circuit such as the circuit of FIG. 2, so as to cause the additional diodes to break down further to the occurrence of an overvoltage and before breakdown of the power transistor cells, thus providing a temporary conduction of the power transistor TP.

As is apparent to those skilled in the art, various modifications can be made to the above disclosed preferred embodiments, in particular regarding the number and the arrangement of the additional cells according to the invention and the use of detection diodes formed by these cells in a circuit for turning on a main transistor that can be, as above indicated, a VDMOS transistor, an IGBT-type transistor, or any component having an analogous operation and structure.

Figure 5:
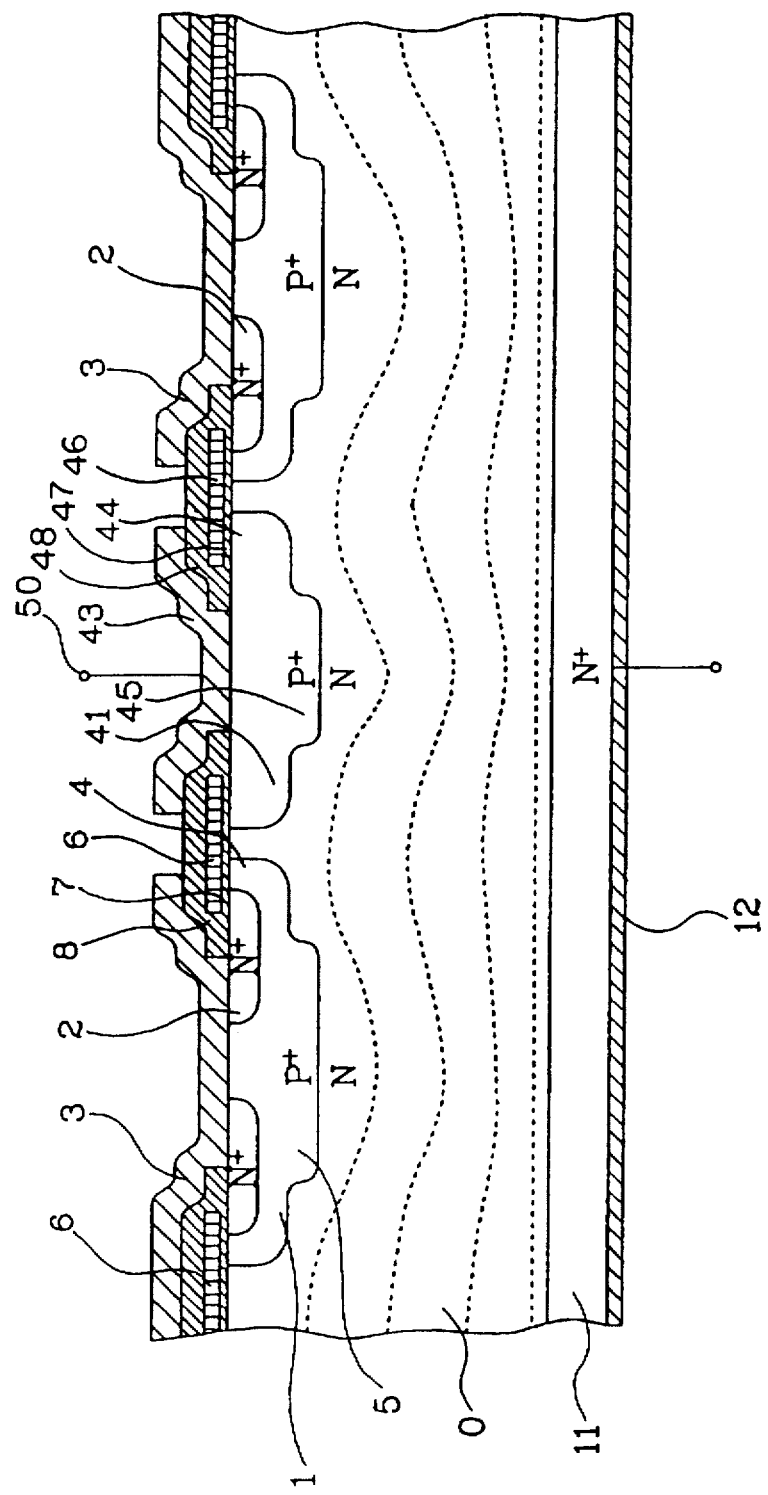
FIG. 5 is a partial cross-sectional view of a specific embodiment of a VDMOS transistor according to the invention.
Figure 6:
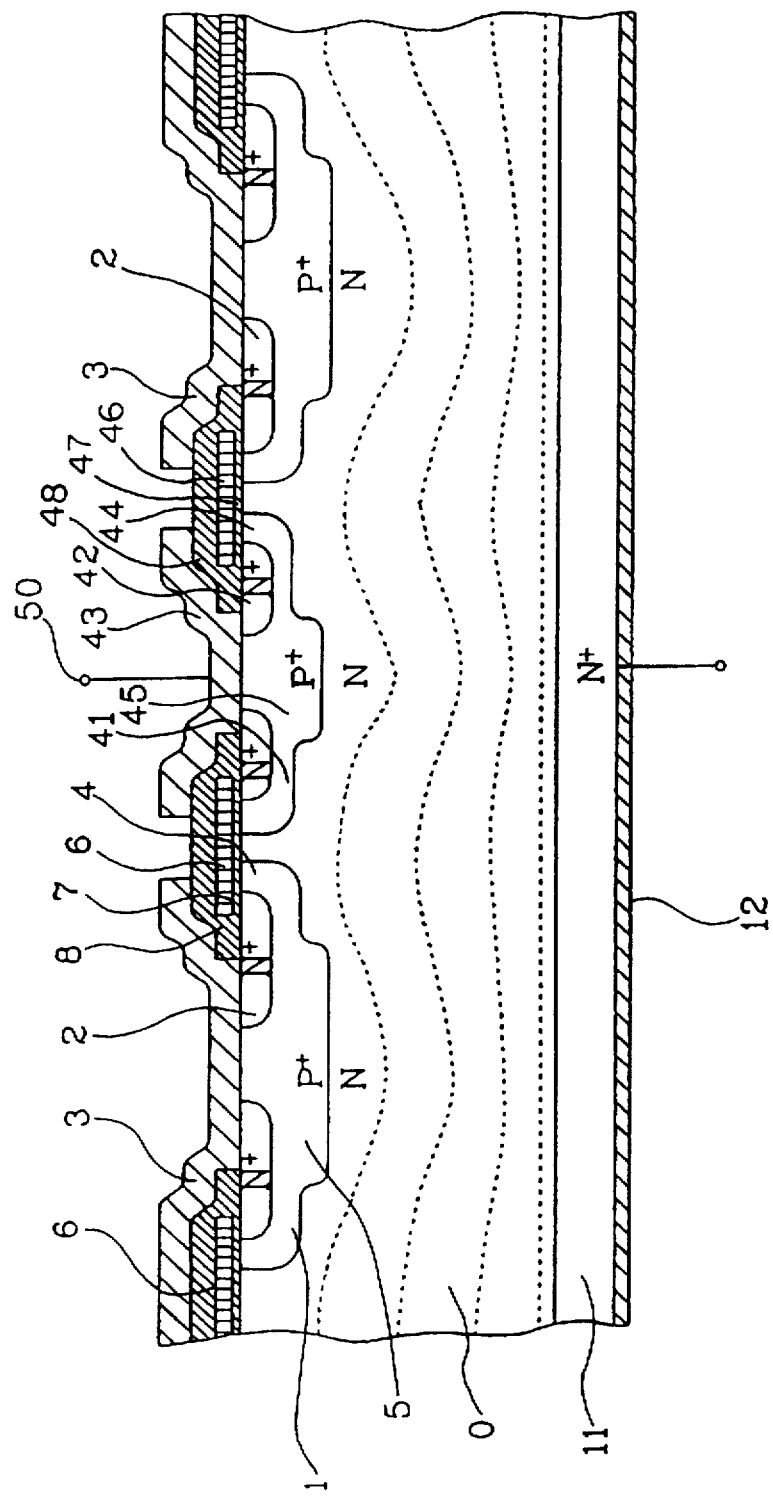
FIG. 6 is a partial cross-sectional view of another embodiment of the VDMOS transistor, according to the invention.

According to an alternative embodiment of the invention, it is possible to eliminate the N⁺-type doped areas 42 within the P⁺ doped well regions of the additional cells since, in these additional cells, the function of these areas is not preponderant for the operation of the circuit. FIG. 5 shows similarly to FIG. 3 an embodiment of the invention in which areas 42 are eliminated in the additional cells. FIG. 6 illustrates an embodiment of the VDMOS transistor in which the P⁺ well region 45 of the additional cell has a smaller size and depth, at its deeper and more central portion, than the P⁺ well region of the plurality of identical cells.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A VDMOS or IGBT-type power transistor, comprising:

a plurality of identical active cells, each of which includes in an upper surface of a substrate of a first conductivity type, a low doped well of the second conductivity type, the low doped well having a deeper and more highly doped central portion and a peripheral region, an upper surface of the peripheral region of each low-doped well having a high doped region of the first conductivity type, a second main electrode contacting an upper surface of the central portion and the upper surface of the peripheral region, a control electrode being disposed, with interposition of an insulating layer, over a portion of an upper surface of the high doped region of the first conductivity type and the upper surface of the peripheral region of each low-doped well, a first main electrode being formed on a lower surface of the substrate; and at least one additional transistor cell having a low doped well region of the second conductivity type, the low doped well region having a deeper and more highly doped central portion and a peripheral region, and a high-doped region of the first conductivity type within the peripheral region of the low doped well region, the low doped well region of the at least one additional cell having a smaller lateral size, at least at its deeper and more highly doped central portion, than the low doped well region of the plurality of identical active cells.

2. A MOS or IGBT-type vertical power transistor comprising:

a semiconductor substrate having a bottom surface including a first electrode;

a number of identical transistor cells formed within a top surface of the semiconductor substrate which are connected in parallel between the first electrode, a second electrode and a control electrode, both the second electrode and control electrode being formed on the top surface of said semiconductor substrate;

at least one additional transistor cell, disposed between the first electrode and the control electrode of the number of identical transistor cells and formed in the substrate, the at least one additional transistor cell having a same structure as said number of identical transistor cells but having proportions which are a fraction of the size of the number of identical transistor cells so that the at least one additional cell has an avalanche threshold lower than an avalanche threshold of the number of identical transistor cells.

3. The vertical power transistor of claim 2, wherein the number of identical transistor cells of the power transistor are arranged in rows and columns, and wherein the at least one additional transistor cell is disposed along a row arranged among the rows of the identical active cells.

4. The vertical power transistor as claimed in claim 2, wherein the number of identical transistor cells and the at least one additional transistor cell each include a doped well region and wherein the doped well region of the at least one additional transistor cell has a smaller area than the doped well region of the number of identical transistor cells, and wherein the doped well region of the number of identical transistor cells penetrates further into the top surface of the semiconductor substrate than the doped well region of the at least one additional transistor cell.

5. The vertical power transistor as claimed in claim 4, wherein the doped well region of the number of identical transistor cells and the at least one additional transistor cell each include a source diffusion region, and wherein the source diffusion region of the at least one additional transistor cell has a smaller square area than the source diffusion region of the number of identical transistor cells.

6. The VDMOS or IGBT-type power transistor as claimed in claim 1, wherein the at least one additional cell has an avalanche threshold lower than an avalanche threshold of the plurality of identical active cells.

7. The MOS or IGBT-type vertical power transistor as claimed in claim 2, wherein the at least one additional transistor cell is turned on, in response to a voltage across the first electrode and the second electrode of the number of identical cells, before the number of identical cells reach an avalanche threshold.

8. The MOS or IGBT-type power transistor as claimed in claim 6, wherein the at least one additional cell is disposed between the first main electrode and the control electrode of the plurality of identical active cells and wherein the at least one additional transistor cell is turned on, in response to a voltage across the first main electrode and the second main electrode of the plurality of identical active cells, before the plurality of identical active cells reach the avalanche threshold.

* * * * *